United States Patent [19]

Hata et al.

[11] Patent Number: 4,793,707
[45] Date of Patent: Dec. 27, 1988

[54] ILLUMINATING DEVICE AND METHOD FOR A COMPONENT DETECTING APPARATUS

[75] Inventors: Kanji Hata, Katano; Masahiro Maruyama, Mino; Eiji Itemadani, Sakai, all of Japan

[73] Assignee: Matsushita Electric Industrial Co., Ltd., Kadoma, Japan

[21] Appl. No.: 60,554

[22] Filed: Jun. 11, 1987

[30] Foreign Application Priority Data

Jun. 12, 1986 [JP] Japan ................... 61-136587

[51] Int. Cl.⁴ ............................................. G01B 11/00
[52] U.S. Cl. ............................. 356/375; 29/721; 29/759; 358/101
[58] Field of Search .................. 356/138, 375, 399; 358/101; 901/40, 47; 364/488, 489, 490, 491, 513; 29/720, 721, 729, 740, 759, 703

[56] References Cited

U.S. PATENT DOCUMENTS 4,628,464 12/1986 McConnell ..................... 29/759

FOREIGN PATENT DOCUMENTS 60-28298 2/1985 Japan .

Primary Examiner—F. L. Evans
Attorney, Agent, or Firm—Cushman, Darby & Cushman

[57] ABSTRACT

A method of optical recognition of a component suction-gripped by a suction nozzle, wherein, when a small component (P) is illuminated by a first illuminator (23), from cone-shaped reflector provided on the base part of a sucking nozzle (3), thereby making a silhouette image of the small component, and when a large component (P') is suction-gripped, a second illuminator, having two-piece movable translucent sheets (25a+25b, which are opened to pass the large component (P') through a thus-opened gap, illuminates the large component (P') to make its silhouette image. By using a lightweight nozzle, a silhouette of the large component is obtainable, assuring high speed mounting of components.

aims, 6 Drawing Sheets

FIG. 8(a)
FIG. 8(b)
FIG. 8(c)
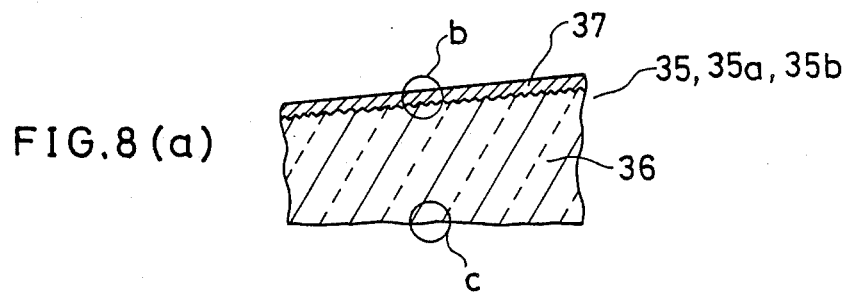
FIG. 9
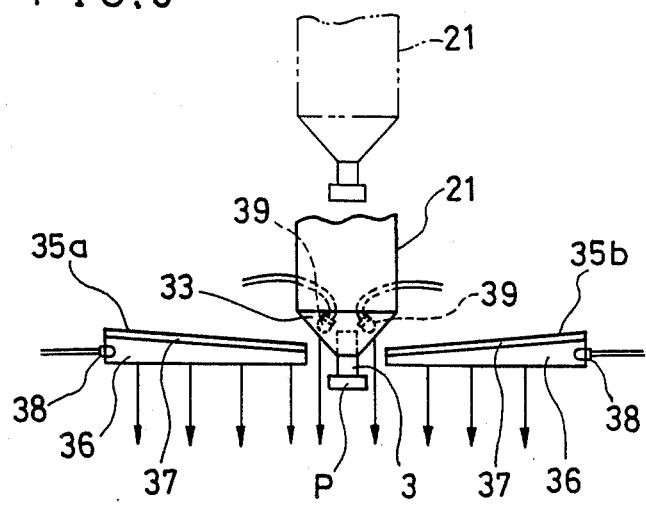

ILLUMINATING DEVICE AND METHOD FOR A COMPONENT DETECTING APPARATUS

FIELD OF THE INVENTION AND RELATED ART STATEMENT

1. Field of the Invention

The present invention relates generally to a component detection method and apparatus therefor, and particularly to an improvement in a method and apparatus for providing illumination to enable optical detection of position which is suitable for an electronic circuit assembling operation.

2. Description of the Related Art

Hitherto, for instance, in a component mounting apparatus for mounting small electronic components sucking it by a suction head from a component holder cassette for mounting onto a printed circuit substrate, provision of component detection apparatus for optical detecting position of the component sucked by the suction nozzle for accurate mounting of the component is already known. The above-mentioned prior art is disclosed, for instance, in the Japanese unexamined published patent application No. Sho 60-28298, wherein as shown in FIG. 10 thereof, a back reflector 43 consisting of a good light reflecting substance is provided around a suction nozzle 42, by which a small electronic component P is sucked at its lower end tip, and light beams 44', 44' are projected from light projectors 44, 44 on the lower face of the back reflector 43, so that a silhouette image of the small electronic component P is given to an image detection camera 45 for detection of the existence or fact of being held by suction at a right position, of the small electronic component P.

The above-mentioned conventional component-detection apparatus has a problem that when the electronic component to be gripped by suction by the nozzle 42 is sometimes so large as, e.g. 36 mm length, a back reflector 43 of very large size becomes necessary to give large silhouette for the detection camera, and such large back reflector 43 inevitably makes the suction head large 41 and lowers the moving speed, hence the mounting speed, and hence disabling high speed assemblage.

SUMMARY OF THE INVENTION

The object of the present invention is to provide an improved method and apparatus for optical component detection, and particularly for use in a method of illumination which enables uniform illumination for both of small and large components and further permits one to eliminate the hitherto-provided large size back reflector.

In order to achieve the above-mentioned purpose, the method of component-detection by illumination for making a silhouette of a component in accordance with the present invention comprises the steps of:

when a small component is sucked and held hung by a
  suction nozzle having a suction opening at its lower end, a first illumination means fixed to the suction nozzle illuminates the component to make a silhouette image of the small component, and when a large component is sucked and held by the
  sucking nozzle, a second illumination means, which is mounted apart from the suction nozzle and is disposed at a level which is lower than the first illumination means but above the lower end of suction nozzle, illuminates the component to make a silhouette image of the large component.

Further, the above-mentioned method is achieved by a component detection apparatus comprising:

a first illumination means which has a smaller illumination area and is provided fixed around a component suction nozzle having a suction opening at its lower end to make a silhouette of a small component suction-gripped by the suction nozzle, and a second illumination means which has larger illumination area and is provided further around the first illumination means in a manner to permit the suction nozzle to pass therethrough and, at a position which is lower than the first illumination means and is higher than the lower end of the suction nozzle.

The second illumination means can be illuminated by a light source common with that of the first illumination means or by a light source provided independently for itself, and the light source is preferably adjusted so that the intensities of the illumination of the second illumination means seen from an illuminometer is equivalent that to that of the first illumination means.

The above-mentioned first illumination means may be a substantially cone-shaped reflector disposed around the suction nozzle, and the second illumination means may consist of two slidingly openable-closable movable light diffusion means which is to be opened left and right from the closed position which is substantially to the position of axis of the suction nozzle, for passing the large component suction-gripped by the suction nozzle.

As a result of the above-mentioned configuration, when the small component is suction-gripped at the nozzle end, the silhouette image to be projected to a pattern detection device is made by the first illumination means. But, when a large component such as a molded LSI is suction-gripped at the nozzle end, the silhouette image is made by the second illumination means which is located relatively above the large component, which passes down to a position lower than the level of the diffusion means.

According to the preferred embodiment of the present invention, by means of the first illumination means and the second illumination means, the illumination can be made uniformly at equal illumination intensity both for a small component such as a small IC chip and a large component such as a molded LSI, so that the suction nozzle only need to have the small first illumination means, and does not itself need to carry large illumination means as hitherto was considered to be necessary. Therefore, the overall suction nozzle can be made small and light weight, which enables fast moving thereof.

As shown by the embodiment, by dividing the light-diffusion means of the second illumination means into two slidably moving members, the suction head can be operated in the same way both for small components and large components, making substantially the same illumination silhouette images of both types of components for optical detection.

BRIEF DESCRIPTION OF THE DRAWINGS

FIG. 1 is a partially-sectional front view showing a state of conducting pattern recognition of in regard to a small component.

FIG. 2(a) and FIG. 2(b) are partially-sectional front views showing operations when a large component is suction-gripped by the nozzle.

FIG. 3 is a sectional elevation view of an essential part of the component detection apparatus.

FIG. 4 is a plan view of the essential part shown in FIG. 3.

FIG. 5 is an overall perspective view of a component mounting apparatus which utilizes the component-detection apparatus in accordance with the present invention.

FIG. 6, FIG. 7 and FIG. 8 show a second embodiment of the present invention, wherein:

FIG. 6 is a partially-sectional front view of an essential part of the second embodiment when a small component is suction-gripped by a suction nozzle, FIG. 7 is a partially-sectional front view showing a state when a large component is suction-gripped by the suction nozzle.

FIG. 8(a) is an enlarged sectional view of the light diffusion means.

FIG. 8(b) is a further-enlarged sectional side view of FIG. 8(a).

FIG. 8(c) is the smaller further-enlarged sectional view of the part C of FIG. 8(a).

FIG. 9 is a partially-sectional front view of an essential part of a modification of the second embodiment.

DESCRIPTION OF THE PREFERRED EMBODIMENT

Figure 1:
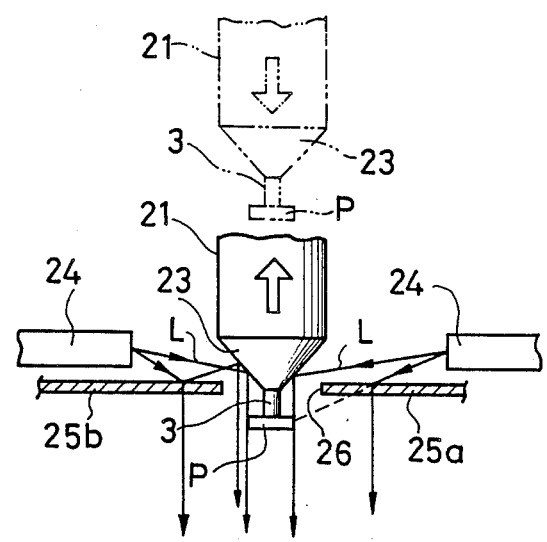
FIG. 1, FIG. 2, FIG. 3, FIG. 4 and FIG. 5 show a first embodiment of the present invention.
Figure 2:
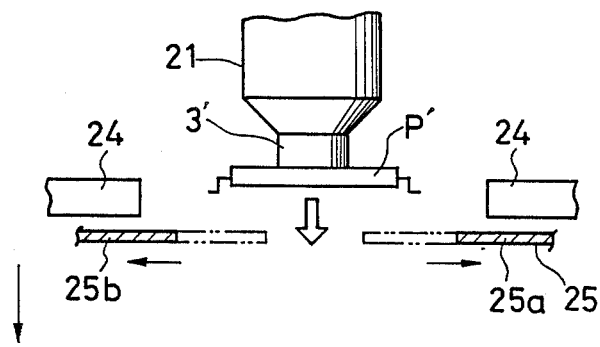
Figure 2:
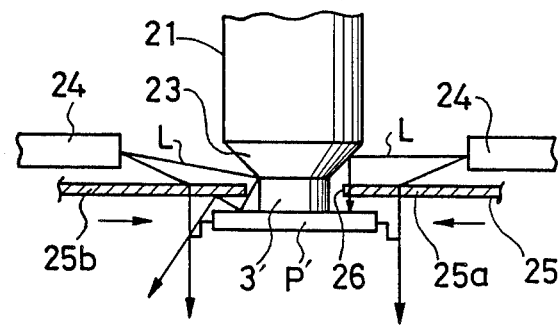

A first preferred embodiment of the present invention is described with reference to FIG. 1, FIG. 2, FIG. 3, FIG. 4 and FIG. 5. In FIG. 5, which is a perspective view showing substantial parts of a component-mounting apparatus, the component detection apparatus in accordance with the present invention is included and method for the component detection in accordance with the present invention is carried out. A turntable 1 having eight arms around a disk-shaped core is rotatably held by a shaft 101. The turntable 1 is driven intermittently, each time for moving the turn table through a further 45° angle, by the shaft 101. Marks S1, S2, S3, S4, S5, S6, S7 and S8 designate stop positions of respective arms. Each arm has a respective holder which is mounted for rotation about a respective longitudinal axis, which is vertically oriented. Each turn holder 2 has several different kinds of suction nozzles, 3, 3, ..., and the positions of these suction nozzles 3, 3, ... of different kinds on each arm is varied or shifted by rotation of the respective holders 2 through the driving of a gear 200 connected thereto. In a rear position (position of S1) of the turn table 1, which position (S1) is a component pickup position, a slidable table 4 which is slidable in an X direction is provided, so that a number of component-feeding cassettes 5, 5, ... are intermittently moved in the X direction to supply various kinds of components. In a front position, which is a component-mounting position (position of S5), an X-Y table 6 is provided for carrying a printed circuit substrate (hereafter substrate) 10, onto which the picked up component is mounted. The Y direction is perpendicular to the X direction and is also the direction which extends from the axis of the shaft 101 to the front position (S5).

At the stopping positions S2, S3 and S4 which lie between the component pickup position S1 and the component mounting position S5, there are provided a known radial direction position-adjusting device 7, an X-Y position-detecting apparatus 8, and an angle-and-position-adjusting apparatus 9 which is an rotation-adjusting means for slightly rotating the suction nozzle 3 at the position S4, respectively. The above-mentioned radial direction-adjusting apparatus 7 comprises a pair of clamp members 7a and 7b which push the component in the correct direction and toward the correct axial position. The component-detection apparatus 8 detects X-Y positions and angular positions of the component P by projecting a silhouette image of the component P onto a CCD recognition camera 11. For the projecting of the silhouette image of the component, a pair of reflection mirrors 12a and 12b is provided to permit light to pass, and the belowmentioned compoent-illumination apparatus 100 in accordance with the present invention is provided. Details of the component-detection apparatus are omitted in FIG. 5 for simplicity of illustration.

The above-mentioned suction nozzle rotating means 9 is constituted by a driving shaft 15 which is to be pressed on a contacting top face 17 of the suction nozzle 3 when adjustment is made. When the angular position of the suction nozzle 3 needs to be adjusted, the adjusting shaft 16 is pushed down by a known up-down thrust bearing holder (not shown) and the motor 13 is rotated for necessary angle. The stopping positions S6 and S7 are positions of a substandard goods-receiving bucket 18 and a nozzle selection apparatus. The nozzle selection apparatus comprises a pinion 19b which is provided to be engaged for the selection motion with the gear 200 which is connected to the holder 2 and driven by a motor 19a.

Now, detailed elucidation is made hereafter for the component-detection means 8, especially the optical component-illumination apparatus 100, with reference to FIG. 1, FIG. 2(a) and FIG. 2b, FIG. 3 and FIG. 4.

As shown in FIG. 1, the suction nozzle 3 has an upper larger diameter part 21 and a cone-shaped reflector part 23 therebetween. The component P is suction-gripped and held at the lower end tip of the sucking nozzle 3. The cone-shaped reflector 23 as a first illumination means is made of a translucent material such as frosted glass, milk-white glass or translucent plastic, and a part of the light projected thereto is irregularly reflected at the surface thereof, and the other part of the light goes inside of the translucent substance and again comes out irregularly, and thus effectively makes irregular reflection. The suction nozzle 3, drawn in chain line, shows an elevated position and that drawn in solid line shows the component-recognition position which is the lowest position of the suction nozzle 3. A pair of light sources 24, 24 is provided at substantially the same level as the cone-shaped reflector 23 in a manner such that the cone-shaped reflector 23 reflects light from the light sources 24, 24 downward, thereby making a silhouette image of the component P. It is preferable that two or more light sources 24 are provided around the cone-shaped reflector 23 so as to uniformly illuminate the reflector 23. At a level which is lower than the light sources 24, 24, a plurality of second translucent sheets 25, 25 or diffusion means is provided as a second illumination means. Each translucent plate 25 is made of frosted glass sheet or milk white glass sheet or translucent plastic sheet or the like translucent sheet. As shown in FIG. 4, which is a plan view of the component-detection apparatus, the diffusion sheets 25, 25 are configurated in two divided sheets which are divided by a line crossing the axis of the suction nozzle 3, and a half circle-shaped recess is formed on each slidable translucent sheet 25a or 25b, so as to make a through-hole 26 when two translucent sheets close their gap as shown in FIG. 4. Two slidable translucent sheets are closed as shown in the state of FIG. 4 when a small size component is suction-gripped by the suction nozzle 3, but the two slidable translucent sheets 25a and 25b are opened-apart as shown in FIG. 2(a) when a large component such as a molded LSI or IC 1000 is suction-gripped by the suction nozzle 3, and the suction nozzle 3 is brought down. Thereafter, the translucent sheets 25a and 25b are again closed together as shown in FIG. 2(b) after the large component P is brought down to a level which is lower than the translucent sheets 25a and 25b.

Figure 3:
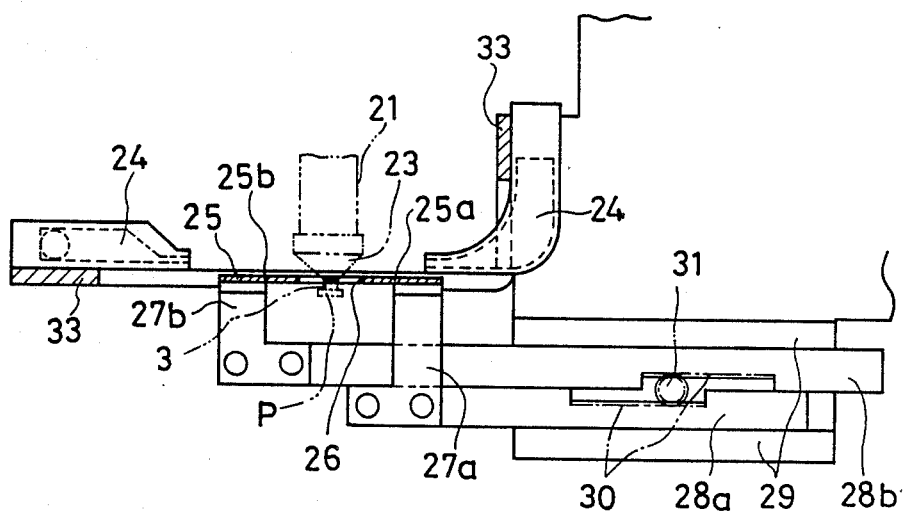
Figure 4:
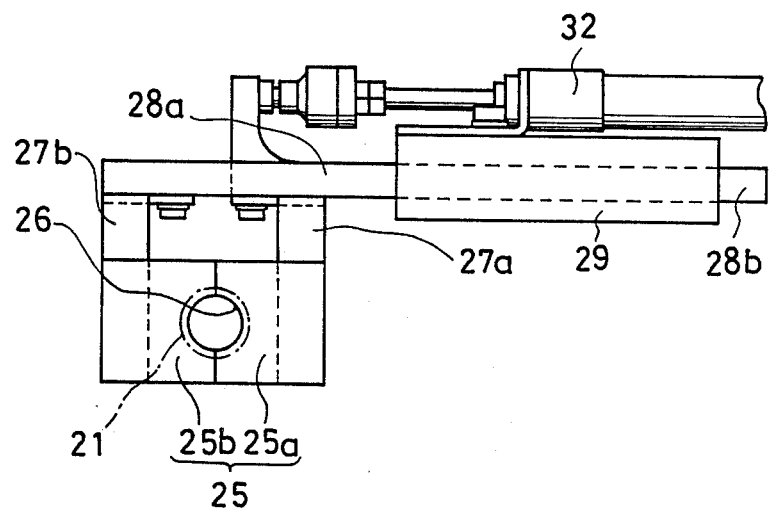
Figure 5:
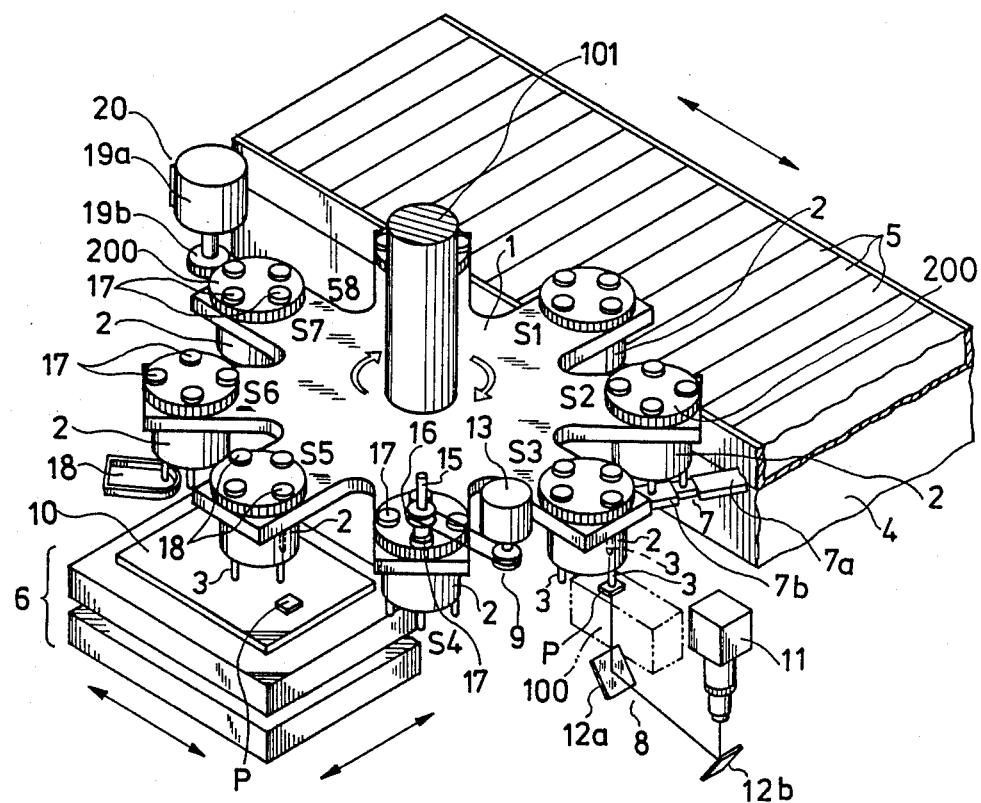

Further, concrete configuration of the embodiment is elucidated with reference to FIG. 3 and FIG. 4, which show a mechanical construction for moving the translucent sheets 25a and 26b, and related parts such as light sources 24, 24.

The two divided light diffusion sheets 25a and 25b are held, by means of respective brackets 27a and 27b, by a pair of slidable levers 28a and 28b. These slidable levers 28a and 28b are slidably held by a frame 9, and racks 30, 30 are formed on opposing faces of the respective slidable levers 28a and 28b. A pinion 31 is provided in engagement with the racks 30, 30, so as to relatively make the slidable levers 28a and 28b slide in opposite directions. One slidable lever 28a is connected to a known driving cylinder 32. As shown in FIG. 3, the light sources 24, 24 are held by supporting members 33 and 33 on a frame of the apparatus.

<OPERATION OF THE FIRST EMBODIMENT>

In the component-detection apparatus of the above-mentioned configuration, position and pattern acknowledgement of small electronic components suction-gripped by the suction nozzle 3 are made as follows: When the suction nozzle stops at the medium position, which is the component-recognition preparation position, as shown in FIG. 1 by imaginary line (chain line), the suction nozzle 3 further moves downward to the component-recognition position. At that time, the suction nozzle 3 passes through the opening 26, which is circle-shaped in the closing state of the light diffusing sheets 25a and 25b, and the component P suction-gripped at the lower end tip of the suction-gripped nozzle 3 is situated lower than the light diffusing sheets 25a and 25b. Then, light rays L are emitted from the light sources 24, 24 on both sides of the conical light reflector 23, and the light rays are reflected by the cone-shaped reflector 23, thereby making light reflect irregularly from the cone-shaped reflector 23 and make the silhouette component pattern thereby. The silhouette component pattern is then incident to the CCD pattern recognition camera 11 (of FIG. 5), and thereby a signal for component position and pattern is produced therefrom. Since the light incident on the CCD pattern recognition camera is made from the irregularly reflected light by the cone-shaped reflector 23, and since the downward component of the light from the light sources 24, 24 is stopped by the light-diffusing sheets 25a and 25b, there is no fear of direct incoming of light from the light sources 24, 24 to the CCD pattern-recognition camera 11. When the component position-recognition is over, the suction nozzle 3 goes up with the component P suction-gripped thereby. After turning of the turntable 1 to the component-mounting position, the suction nozzle 3 again goes down to a predetermined mounting level, and mounts the component P at the predetermined position on the printed circuit substrate 10. At the mounting of the component, the position error, if any, of the suction-gripped component can be adjusted by small rotation of the suction nozzle 3.

When a large component P' is suction-gripped and held by a larger nozzle 3', the holder 2 is rotated so as to bring the larger suction nozzle to the suction position. FIG. 2(a) and FIG. 2(b) show the state when a larger component P' is suction-gripped by a larger suction nozzle 3'.

After being suction-gripped by the suction nozzle, the large component P' is brought to the optical recognition position S3, and then is brought down to a low recognition level position. Before the bringing down of the large component P' to the low level position, the driving cylinder 32 works and opens the light-diffusing sheets 25a and 25b from each other, thereby to allow the downward passage of the large component P' through the widely opened gap therebetween. After stopping of the large component P' at the lowest position, the light diffusing sheets 25a and 25b restore to the closed position. Accordingly, the light emitted from the light sources 24, 24 illuminates the upper face of the closed light diffusing sheets 25a, 25b, which emit diffused light downwards through the light-diffusing sheets 25a and 25b. A silhouette of the large component P' is projected downwards to the CCD recognition camera 11. When the recognition is over, the light diffusing sheets 25a and 25b again open and the suction nozzle 3' and the suction-gripped large component P' are raised and brought to the mounting position S5. By such opening of the light diffusing sheets 25a and 25b, even a large component P' can be brought down and recognized, and the motion of the suction nozzles for large components and small components can be made common. In case the suction nozzle moves in a lateral direction instead of a vertical direction, a slot may be formed on one fixed light-diffusing sheet, so that the suction nozzle may move laterally therethrough.

Figure 6:
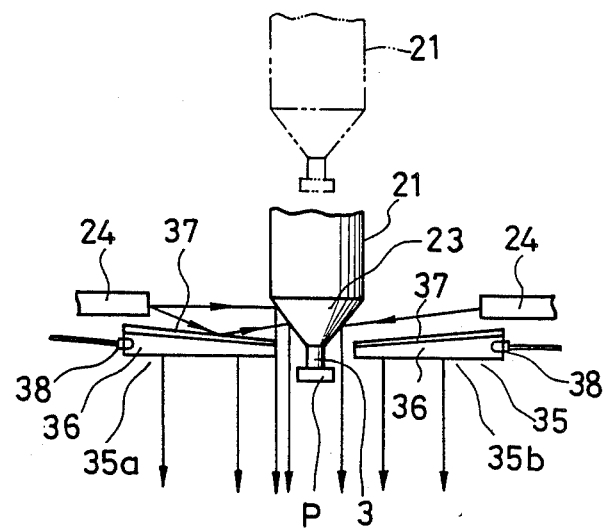
Figure 7:
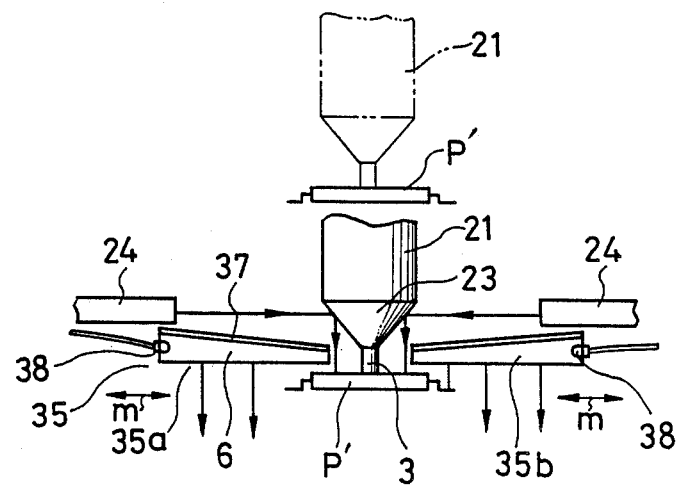
Figure 10:
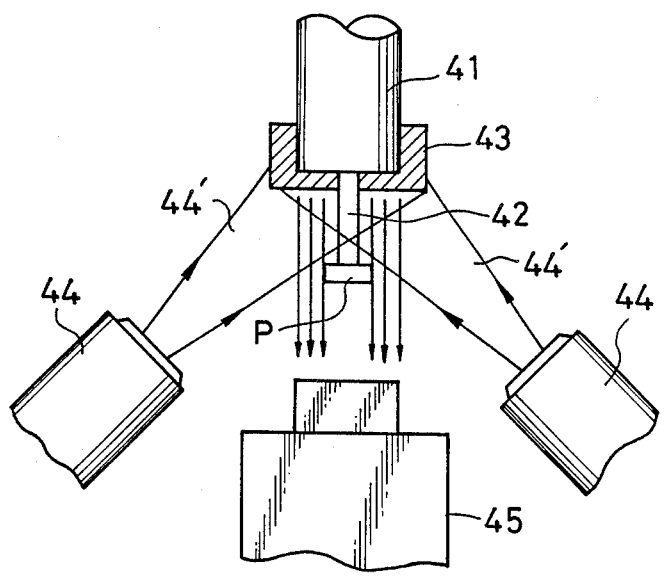
FIG. 10 is the schematical sectional front view of a conventional optical component detection apparatus.

Next, a second embodiment is elucidated with reference to FIG. 6, FIG. 7, FIG. 8(a). FIG. 8(b) and FIG. 8(c).

The main difference between the second embodiment and the first embodiment is that, in the second embodiment the light-diffusing sheets 35a and 35b have their own light sources. Therefore, for the common parts with the first embodiment, the same numerals and marks are used, redundant elucidations thereof are omitted, and only the features which are different from those of the first embodiment are elucidated hereafter.

As shown in FIGS. 6 and 8, the light-diffusing sheet 35, as the second illumination means, is provided under the light sources 24, 24 in a manner to surround the suction nozzle 3. The light-diffusing sheet 35 is configurated in two pieces 35a and 35b divided by a vertical plane including the axis of the suction nozzle 3. Respective divided light-diffusing sheets 35a and 35b comprise wedge-shaped translucent plastic sheets 36, 36 and reflector sheets 37, 37 made of aluminum sheets, or the like bonded on the upper faces of the former, and small light sources 38, 38, for instance LED, provided in recesses made in the thicker end parts of the wedge-shaped light diffusing sheets 35a, 35b. The lower faces of the reflector sheets 37, 37 are roughened as shown in FIG. 8(a) and FIG. 8(b) so as to make irregular reflection of the light emanating from the small light sources 38, 38, and that the lower surfaces of the light diffusing sheets 36, 36 are also made rough, so as to emit dispersed light therefrom. Further, the second illumination means comprising the light-diffusing sheets 36, 36, small light sources 38, 38 and reflector sheets 37, 37 are mounted in a slidable manner as shown in FIG. 7 (by arrows m, m), so that the two diffusing sheets 36, 36 part from each other thereby to make a wide opening therebetween for allowing a large component P' therethrough.

The operation of the above-mentioned second embodiment shown in FIG. 6 to FIG. 8(c) is substantially the same as that of the first embodiment. In this second embodiment however, the light intensities of the small light sources 38, 38 are adjusted independently from that of the light sources 24, 24 so that illuminations of the first illumination means 23 and the second illumination means 35a, 35b are equivalent to each other. By such adjustment, the position recognition by the CCD recognition camera becomes stable, and recognition can be made with high reliability. Incidentally, the lower faces of the light-diffusing sheet 36, 36 are not necessarily limited to being roughened, but may be smooth faced.

FIG. 9 shows still another modification, wherein the first illumination means has built-in-type light sources 39, 39, instead of the light-projecting light sources 24, 24 of the previous embodiments.

The component-detection method and apparatus in accordance with the present invention can, of course, recognize the shape or kinds of object components, besides the position of a suction-gripped component.

Although the invention has been described in its preferred form with a certain degree of particularity, it is understood that the present disclosure of the preferred form could be changed in the details of construction and the combination and arrangement of parts may be resorted to without departing from the spirit and the scope of the invention as hereinafter claimed.

What is claimed is:

1. A method for selectively illuminating small and large components while optically detecting them if they are present at a detection position, comprising:
    (a) providing a detection position and an optical sensor located so as to have a predetermined spatial relationship to the detection position, the optical sensor being one which is capable of sensing the presence, absence and location of a component disposed in said detection position, when light rays are caused to intersect the detection position in such a manner as to illuminate at least part of the component, if present in said detection position, and thereby cast a silhouette of at least part of the component on the optical sensor;
    (b) attempting to suction-grip a small component to a suction nozzle and then moving the suction nozzle so as to place the small component, if gripped thereby, in said detection position;
    (c) illuminating said detection position using a first illuminator provided on said suction nozzle so as to cast a silhouette of at least part of the small component, if gripped by the suction nozzle and located in said detection position, on said optical sensor, and operating said optical sensor at least once to acquire at least one optical sensation;
    (d) thereafter, moving the suction nozzle so as to remove the small component, if gripped by the suction nozzle, away from said detection position, and then releasing suction gripping so as to release the small component from the suction nozzle;
    (e) attempting to suction-grip a large component to a suction nozzle and then moving the suction nozzle so as to place the large component, if gripped thereby, in said detection position;
    (f) illuminating said detection position using a second illuminator which is mounted separately from the suction nozzle and axially closer to the detection position along an axis of the suction nozzle than the first illuminator, so as to cast a silhouette of at least part of the large component, if gripped by the suction nozzle and located in said detection position, on said optical sensor, and operating said optical sensor at least once to acquire at least one optical sensation; and
    (g) thereafter, moving the suction nozzle so as to remove the large component, if gripped by the suction nozzle, away from said detection position, and then releasing suction gripping so as to release the large component from the suction nozzle.

2. The method of claim 1, wherein:
the suction nozzle is moved in steps (b), (d), (e) and (g) at least partially by providing the nozzle on a turntable and rotating the turntable; and
the detection position is illuminated in steps (c) and (f) by providing a light emitter separate from said first and second illuminators, and causing light to be emitted therefrom and to irradiate said first and second illuminators and to be redirected therefrom towards said detection position.

3. The method of claim 1, wherein:
the suction nozzle is moved in steps (b), (d), (e) and (g) at least partially by providing the nozzle on a turntable and rotating the turntable;
the detection position is illuminated in step (c) by providing a light emitter separate from said first and second illuminators, and causing light to be emitted therefrom to irradiate said first illuminator and to be directed therefrom towards said detection position; and
the detection position is illuminated in step (f) by providing a light emitter separate from said first illuminator but joined with said second illuminator, and causing light to be emitted therefrom to irradiate said second illuminator and to be directed therefrom towards said detection position.

4. The method of claim 1, wherein:
the suction nozzle is moved in steps (b), (d), (e) and (g) at least partially by providing the nozzle on a turntable and rotating the turntable.

5. The method of claim 4, wherein:
the second illuminator is provided as a plurality of parts which are movable transversally towards and away from said axis;
the suction nozzle is further moved in step (e) axially towards said detection position and in step (g) axially away from said detection position; and
said second illuminator is operated between steps (e) and (f) to move said parts towards said axis from respective open to respective closed positions, and is operated between steps (f) and (g) to move said parts away from said axis from respective closed to respective open positions.

6. Apparatus for selectively illuminating small and large components while optically detecting them if they are present at a detection position, comprising:

(a) an optical sensor located so as to have a predetermined spatial relationship to the detection position, the optical sensor being one which is capable of sensing the presence, absence and location of a component disposed in said detection position, when light rays are caused to intersect the detection position in such a manner as to illuminate at least part of the component, if present in said detection position, and thereby cast a silhouette of at least part of the component on the optical sensor;

(b) a suction nozzle for attempting to grip a small component, and means for moving the suction nozzle so as to place the small component, if gripped thereby, in said detection position;

(c) means, including a first illuminator provided on said suction nozzle, for illuminating said detection position so as to cast a silhouette of at least part of the small component, if gripped by the suction nozzle and located in said detection position, on said optical sensor, so that the optical sensor may be operated at least once to acquire at least one optical sensation while said first illuminator is being operated;

(d) said means for moving the suction nozzle being operable after said optical sensor has been operated while said first illuminator is being operated, for removing the small component, if gripped by the suction nozzle, away from said detection position, and the suction nozzle being operable for releasing suction gripping so as to release the small component from the suction nozzle;

(e) a suction nozzle for attempting to suction-grip a large component, and means for moving this suction nozzle so as to place the large component, if gripped thereby, in said detection position;

(f) means, including a second illuminator mounted separately from the suction nozzle of (e), for illuminating said detection position so as to cast a silhouette of at least part of the large component, if gripped by the suction nozzle of (e) and located in said detection position, on said optical sensor, so that the optical sensor may be operated at least once to acquire at least one optical sensation while said second illuminator is being operated; and (g) said means for moving the suction nozzle of (e) being operable after said optical sensor has been operated while said second illuminator is being operated, for removing the large component, if gripped by the suction nozzle of (e), away from said detection position, and the suction nozzle and (e) being operable for releasing suction gripping so as to release the large component from the suction nozzle of (e);

(h) said first illuminator having a smaller illuminated surface area than said second illuminator; and (i) said second illuminator being located axially closer to the detection position along an axis of the respective said suction nozzle than said first illuminator; and (j) said second illuminator being constructed and arranged to permit said large component, when suction-gripped by the suction nozzle of (e), to be moved axially past said second illuminator by said moving means of (g).

7. The apparatus of claim 6, wherein:
said first illuminator comprises a translucent illuminated surface from which light is directed towards said detection position.

8. The apparatus of claim 7, wherein:
said translucent illuminated surface is conical about said axis and tapers towards said detection position.

9. The apparatus of claim 6, wherein:
said second illuminator comprises a plurality of parts which are movable transversally towards and away form said axis so that the second illuminator can be closed around the nozzle of (e) for use, and opened from around the nozzle of (e) in order to facilitate axial withdrawal of the nozzle of (e) and the large component suction gripped thereto away from said detection position.

10. The apparatus of claim 9, wherein:
each of said parts of said second illuminator comprises a translucent illuminated surface from which light is directed towards said detection position.

11. The apparatus of claim 10, wherein:
each said part of said second illuminator has said translucent illuminated surface as a front surface thereof and further includes a light emitter for illuminating said front surface from axially therebehind, and a rough-surfaced reflector located axially behind the respective said light emitter for reflecting emitted light onto said front surface from axially therebehind.

* * * * *